(12) United States Patent
Tulapurkar et al.

(10) Patent No.: US 9,088,243 B2
(45) Date of Patent: Jul. 21, 2015

(54) MAGNETIC FIELD FEEDBACK BASED SPINTRONIC OSCILLATOR

(71) Applicant: Indian Institute of Technology Bombay, Mumbai (IN)

(72) Inventors: Ashwin Tulapurkar, Mumbai (IN); Chakkalakal Tomy, Mumbai (IN); Yoshishige Suzuki, Osaka (JP); Dinesh Kumar, Mumbai (IN); Katsunori Konishi, Osaka (JP)

( * ) Notice: Subject to any disclaimer, the term of this patent is extended or adjusted under 35 U.S.C. 154(b) by 0 days.

(21) Appl. No.: 14/023,155

(22) Filed: Sep. 10, 2013

(65) Prior Publication Data

US 2014/0070896 A1    Mar. 13, 2014

(30) Foreign Application Priority Data

Sep. 10, 2012 (IN) .......................... 2617/MUM/2012

(51) Int. Cl.
*H03B 15/00* (2006.01)
(52) U.S. Cl.
CPC ................................. *H03B 15/006* (2013.01)
(58) Field of Classification Search
CPC .... H03B 15/00; H03B 15/003; H03B 15/006; H03L 7/26
USPC ............................ 331/3, 94.1, 107 SL, 107 T
See application file for complete search history.

(56) References Cited

U.S. PATENT DOCUMENTS

| | | | | |
|---|---|---|---|---|
| 4,518,931 A * | 5/1985 | Rauscher | .......................... | 331/76 |
| 7,067,839 B2 * | 6/2006 | Uzawa et al. | .................... | 257/31 |
| 7,471,491 B2 * | 12/2008 | Sato et al. | ...................... | 360/313 |
| 7,678,475 B2 * | 3/2010 | Slavin et al. | .................. | 428/811 |
| 7,764,136 B2 * | 7/2010 | Suzuki et al. | ........... | 331/107 SL |
| 7,924,107 B2 * | 4/2011 | Koyama et al. | ............ | 331/107 T |
| 8,274,052 B1 * | 9/2012 | Fukuzawa et al. | ......... | 250/341.1 |
| 8,553,372 B2 * | 10/2013 | Nagasawa et al. | ......... | 360/324.2 |
| 2012/0119838 A1* | 5/2012 | Koyama et al. | ............... | 331/115 |

* cited by examiner

*Primary Examiner* — Levi Gannon

(57) ABSTRACT

The embodiments herein relate to a magnetic field feedback based spintronic microwave oscillator driven by DC current. The microwave oscillator works based on a magnetic tunnel junction structure connected to a feedback waveguide. Any fluctuation in the magnetization direction of free magnetization layer of MTJ drives an oscillating current through the feedback waveguide which in turn exerts an oscillating magnetic field on the free layer and amplifies the magnetization fluctuations. If the DC current passing through the MTJ is more than a critical value, continuous processing states of the magnetization are possible. The critical current is independent of the thickness and magnetization of the free layer. A MTJ can be driven into spontaneous oscillations with DC current and magnetic field feedback circuit and can act as a spintronic microwave oscillator.

24 Claims, 11 Drawing Sheets

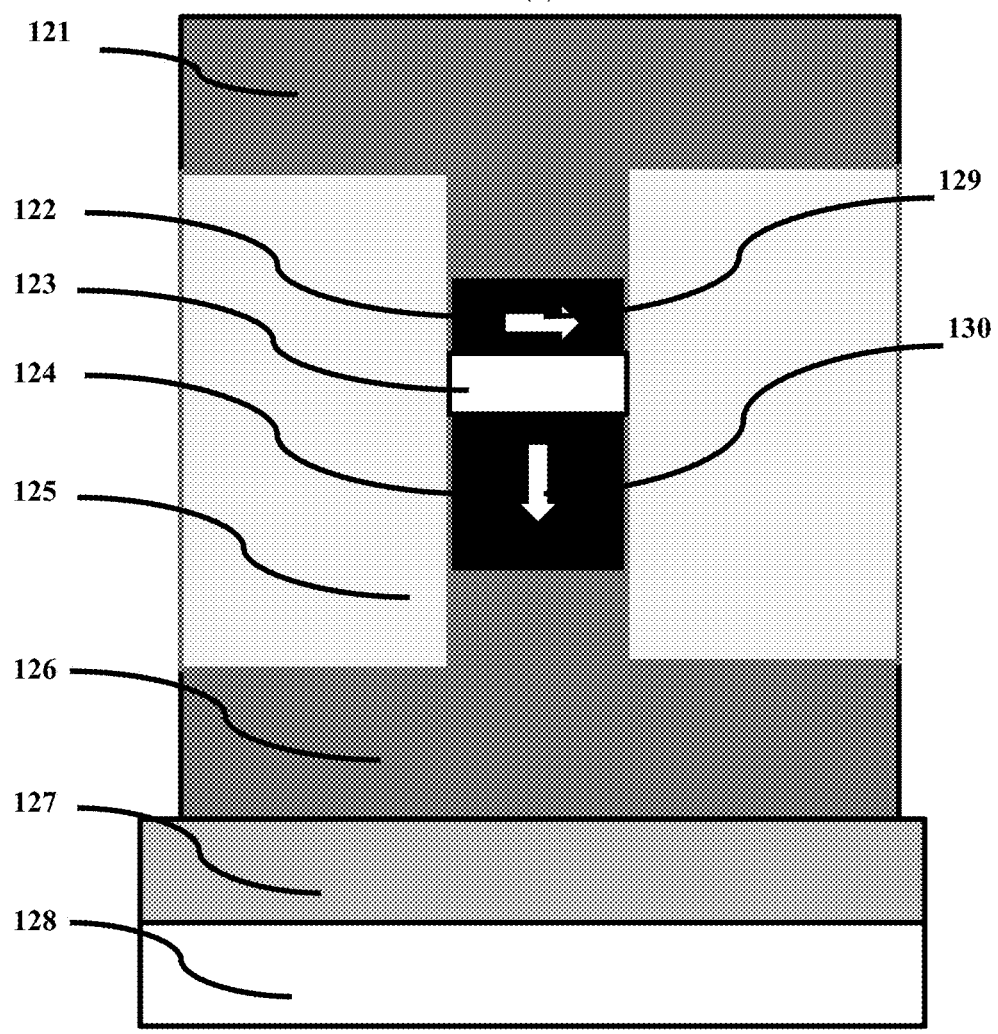

US 9,088,243 B2

MAGNETIC FIELD FEEDBACK BASED SPINTRONIC OSCILLATOR

PRIORITY DETAILS

The present application is based on, and claims priority from, IN Application Number 2617/MUM/2012, filed on 10 Sep. 2012, the disclosure of which is hereby incorporated by reference herein.

TECHNICAL FIELD

The present subject matter described herein in general relates to a system and method for generating and manipulating oscillating microwave signal, and more particularly, to an alternative magnetic field feedback based spintronic microwave oscillator.

BACKGROUND

Spintronic devices are being currently developed, wherein spintronic devices harness the spins of electrons (rather than just their electric charges), which may enable new features and functionalities that go beyond those possible with conventional electronic devices. Several spintronic device implementations and applications thereof are carried out in recent times which specifically exploit spin properties instead of or in addition to charge degrees of freedom. The prototype devices that are already manifested vastly in industries span read heads of modern hard-disk drives and memory-storage cells or MRAM (magnetic random access memory), which comprises either giant-magneto resistive (GMR) multi-layered, thin film structure or tunneling magnetoresistive (TMR) thin-film multilayers. A GMR device comprises alternating ferromagnetic and nonmagnetic metal layers. Depending on the relative orientation of the magnetizations in the magnetic layers, the device resistance (also called magneto-resistance) changes from small (parallel magnetizations) to large (antiparallel magnetizations), which may be used to sense changes in magnetic fields. The magnetic tunnel junction (MTJ), on the other hand, comprises two ferromagnetic layers (a fixed/pinned layer and a free layer) separated by a thin insulating layer (typically a few nanometers) (also called the tunneling layer), wherein the tunneling current tunneled through the tunneling layer depends on the relative spin orientation of magnetizations of the two ferromagnetic layers, which can be changed by an applied magnetic field.

Current efforts in designing and manufacturing spintronic devices with magnetic tunnel junction architecture spawn areas such as nano diode or nanometer-scale radio-frequency detector, or nano oscillator which could be used as microwave generating device and microwave detecting device. All these phenomena were based primarily on 'Spin Momentum Transfer' (SMT) or 'Spin Transfer Torque (STT)'.

Nanoscale, spintronic microwave oscillators, which are designed and patented on the Spin-Transfer Torque (STT) effect, commences primarily by passing a dc current through a MTJ. The dc current, gets polarized by the fixed or pinned magnetic layer thereby exerting a STT on the free magnetic layer to drive it into periodic precessional states.

Improvement of the quality factor (i.e. ratio of output frequency and its width) and power output of these nanoscale spintronic oscillator promises better device capability and various work is going towards this end. Thus, an alternative feedback scheme (not based on the spin-transfer torque effect) is of current focus to drive a MTJ device into spontaneous oscillations with higher quality factor.

SUMMARY

Disclosed herein is a strip line integrated microwave oscillating element comprising a strip line having a signal electrode and a ground electrode; a Magnetic Tunnel Junction (MTJ) structure residing within the signal electrode and the ground electrode, wherein the MTJ structure further comprises a magnetization fixed layer formed of a ferromagnetic material and being in contact with at least one of the signal electrode and the ground electrode; a tunnel barrier layer; and a magnetization free layer in contact with at least one of the signal electrode and the ground electrode, wherein a magnetization vector of the magnetization free layer has a component perpendicular to the magnetization vector of the magnetization fixed layer; and a feedback waveguide insulated electrically from the MTJ structure by an electrically insulating layer; wherein an oscillating feedback magnetic field created by the feedback waveguide has a component perpendicular to the magnetization vector of the magnetization free layer of the MTJ structure.

Disclosed herein is a strip line integrated microwave oscillating circuit comprising a dc current source connected between a signal electrode and the ground electrode of a strip line integrated microwave oscillating element; a bias T and at least one of a configurable delay element and a phase shifter connected between the signal electrode and a feedback waveguide of the strip line integrated microwave oscillating element; and a load resistance connected between the feedback waveguide and the ground electrode of the strip line integrated microwave oscillating element.

Disclosed herein is a strip line integrated microwave oscillating circuit comprising a dc current source connected between a signal electrode and the ground electrode of a strip line integrated microwave oscillating element; a bias T, at least one of a coupler and a circulator and at least one of a configurable delay element and a phase shifter connected between the signal electrode and a feedback waveguide of the strip line integrated microwave oscillating element; and a load resistance connected between at least one of the coupler; and circulator and the ground.

Disclosed herein is a method for generating microwave oscillation in a strip line integrated microwave oscillating circuit and a strip line integrated microwave oscillating element comprising passing a dc current from a dc current source through a Magnetic Tunnel Junction (MTJ) structure, wherein the dc current is above a critical value of the dc current; generating an oscillating voltage across a magnetization free layer of the MTJ structure using at least one of thermal fluctuations of the magnetization free layer; producing an oscillating current through a feedback waveguide being connected and insulated from the MTJ structure by the generation of the oscillating voltage across the magnetization free layer; and creating microwave oscillation in the magnetization free layer of the MTJ structure by exerting an oscillating feedback magnetic field by the feedback waveguide on the magnetization free layer.

These and other aspects of the embodiments herein will be better appreciated and understood when considered in conjunction with the following description and the accompanying drawings.

BRIEF DESCRIPTION OF THE FIGURES

Further objects, embodiments, features and advantages of the present embodiment will become more apparent and may be better understood when read together with the detailed description and the accompanied drawings. The components of the figures are not necessarily to scales, emphasis instead being placed on better illustration of the underlying principle of the subject matter. Different numeral references on figures designate corresponding elements throughout different views. However, the manner in which the above depicted features, aspects, and advantages of the present subject matter are accomplished, does not limit the scope of the subject matter, for the subject matter may admit to other equally effective embodiments.

DETAILED DESCRIPTION OF EMBODIMENTS

Figure 1A:
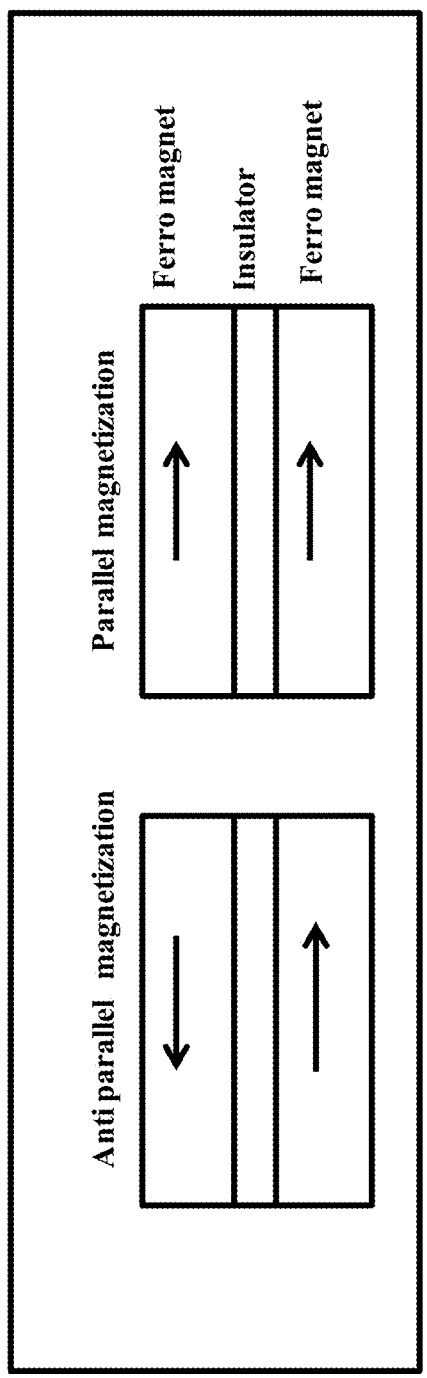
FIG. 1(a) illustrates an exemplary diagram which depicts the working of the magnetic tunnel junctions spintronic oscillator as disclosed in the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

It is to mention here that 'oscillating' and 'fluctuating' being mentioned in the various sections imply the similar facts. Furthermore, the terminologies 'magnetization free layer' and 'free magnetization layer' and 'magnetization fixed layer' and 'fixed magnetization layer' have been used interchangeably in the description of the present subject matter and may not limit the scope by the way of representation.

The embodiments herein disclose a method and apparatus for circuit design of a spintronic oscillator based on a magnetic tunnel junction connected to a feedback waveguide below it. Referring now to the drawings, and more particularly to FIGS. 1 through 4, where similar reference characters denote corresponding features consistently throughout the figures, there are shown embodiments.

Embodiments herein disclose systems and methods of generating oscillating microwave signal in an alternative magnetic field feedback based spintronic oscillator.

One of the embodiments of the present subject matter comprises a spintronic oscillator comprising a strip line integrated microwave oscillating element. The microwave oscillating element comprises a strip line having a signal electrode and a ground electrode, a magnetic tunnel junction (MTJ) structure residing within the signal electrode and the ground electrode, which comprises a magnetization fixed layer formed of a ferromagnetic material and in contact with either one of the signal electrode and the ground electrode, a tunnel barrier layer and a magnetization free layer formed of a ferromagnetic material and being in contact with the other electrode, a magnetization vector of the magnetization free layer has a component perpendicular to the magnetization vector of the magnetization fixed layer and a feedback waveguide insulated electrically from the magnetic tunnel junction structure by an electrically insulating layer, wherein an oscillating feedback magnetic field created by the feedback waveguide has a component perpendicular to the magnetization vector of the magnetization free layer of the magnetic tunnel junction structure.

Further, the embodiments of the present subject matter describes methodology of microwave oscillation generated by the Magnetic Tunnel Junction (MTJ) multilayer structure and element therein and the corresponding circuit thereof, wherein the said free magnetization layer may undergo spontaneous oscillations on a dc current equal to or above a critical value passing through the said MTJ. As the preferred embodiment, the said dc current passing through the said MTJ may be connected to a "feed-back" waveguide, wherein any fluctuation in the magnetization direction of the free layer of the said MTJ may drive a fluctuating current through the feedback waveguide. This may further exert an oscillating feedback magnetic field on the free magnetization layer and may amplify the magnetization fluctuations. If the dc current passing through the MTJ is above a critical value, periodic precessional states of the magnetization are achieved.

The oscillation mechanism of such spintronic oscillator may remain independent of the thickness of the said free layer.

Another embodiment of the present subject matter may comprise the combination of the spin transfer torque (SU) effect and aforementioned feedback circuit effect for designing the spintronic oscillator.

FIG. 1(a) illustrates an exemplary diagram which depicts the working of magnetic tunnel junctions as disclosed in the embodiments herein. A Magnetic Tunnel Junction (MTJ) comprises two layers of magnetic metal, (such as cobalt, iron) separated by an ultrathin layer of insulator (typically aluminum oxide or magnesium oxide), also called the tunneling layer or tunneling barrier. In a preferred embodiment, the thickness of the layer may be about 1 nm. However, a person skilled in the art would understand that the above value merely represent one embodiment of the present subject matter and in no manner limits the scope of the embodiment. Further, the insulating layer is thin enough to allow the electrons tunnel through the barrier if a bias voltage is applied between the two metal electrodes. The resistance across the tunnel barrier depends on the relative orientation of the magnetization of the ferromagnetic layers. The tunneling current depends on the relative orientation of magnetizations of the two ferromagnetic layers which can be altered by an applied magnetic field. If no voltage is applied to the junction, electrons tunnel in both directions with equal rates.

Figure 1B:
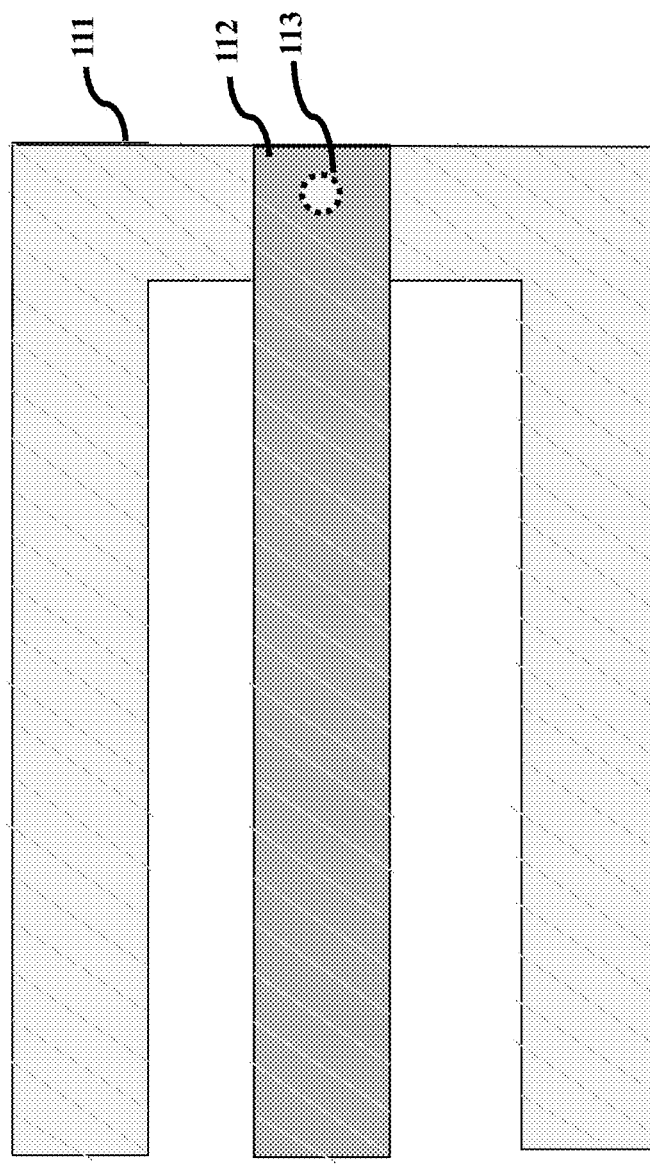
FIG. 1(b) depicts the magnetic tunnel junction (MTJ) structure residing within the signal electrode and the ground electrode, as one of the embodiments of the present subject matter.

When a bias voltage is applied, electrons tunnel preferentially to the positive layer. Further, the total current is split in two partial currents; wherein one current is for the spin up electrons and a second current for the spin down electrons which vary depending on the magnetic state of the junctions. FIG. 1(b) depicts the exemplary embodiment of the present subject matter where the MTJ structure 113 residing within the signal electrode and the ground electrode is shown. The signal electrode and the ground electrode can be interchangeably depicted by 111 and 112, respectively.

For the MTJ structure 112 as shown in FIG. 1(b), a magnetization fixed layer formed of a ferromagnetic material is being in contact with either one of the signal electrode and the ground electrode, which is separated from the magnetization free layer of the MTJ structure by a tunnel barrier layer. The magnetization free layer of the MTJ structure 113 is formed of a ferromagnetic material and being in contact with the other electrode (signal electrode or the ground electrode), for which the magnetization vector of the magnetization free layer has a component perpendicular to the magnetization vector of the magnetization fixed layer. Furthermore, the MTJ element as shown in FIG. 1(b) is placed at the end of the coplanar type strip line, where the ground electrode and the signal electrode cross each other, however being electrically insulated from each other with insulator such as silicon oxide. The MTJ structure connects the signal and ground electrode.

In another embodiment, the MTJ structure may get disposed on a slot line type strip line instead of a coplanar type strip line, wherein the MTJ is also disposed between the signal electrode and the ground electrode. FIG. 1(c) illustrates the schematic of the strip line integrated microwave oscillating element, wherein the signal electrode and the ground electrode can be interchangeably depicted by 121 and 126, respectively, within which resides the MTJ structure with the magnetization fixed layer 124, tunneling layer 123 and the free magnetization layer 122. The MTJ structure is surrounded by a layer made up of electrically insulating material 125. In one of the embodiment, such insulator may be $SiO_2$.

In an embodiment, such a strip line integrated microwave oscillating element as shown in FIG. 1(a), FIG. 1(b), FIG. 1(c) may be formed wherein the magnetic tunnel junction structure comprises material of a magnetization free layer 122 and a magnetization fixed layer 124, which are formed with the tunnel barrier layer 123 being sandwiched there between, comprises: a magnetic metal, such as cobalt, iron, nickel, or chromium, or an alloy thereof; or a magnetic metal multilayer film (such as a multilayer film of cobalt-ruthenium-cobalt, for example) that utilizes antiferromagnetic coupling.

In one of the embodiments of the subject embodiment, the tunnel barrier layer as shown in FIG. 1(a), 1(b), 1(c) may comprise of MgO, wherein the MgO layer is formed either of a single crystal $MgO_x$ (001) or a polycrystal MgO layer. FIG. 1(c) further depicts the feedback waveguide 128, which is electrically insulated from the MTJ structure by an insulating layer 127.

Figure 1D:
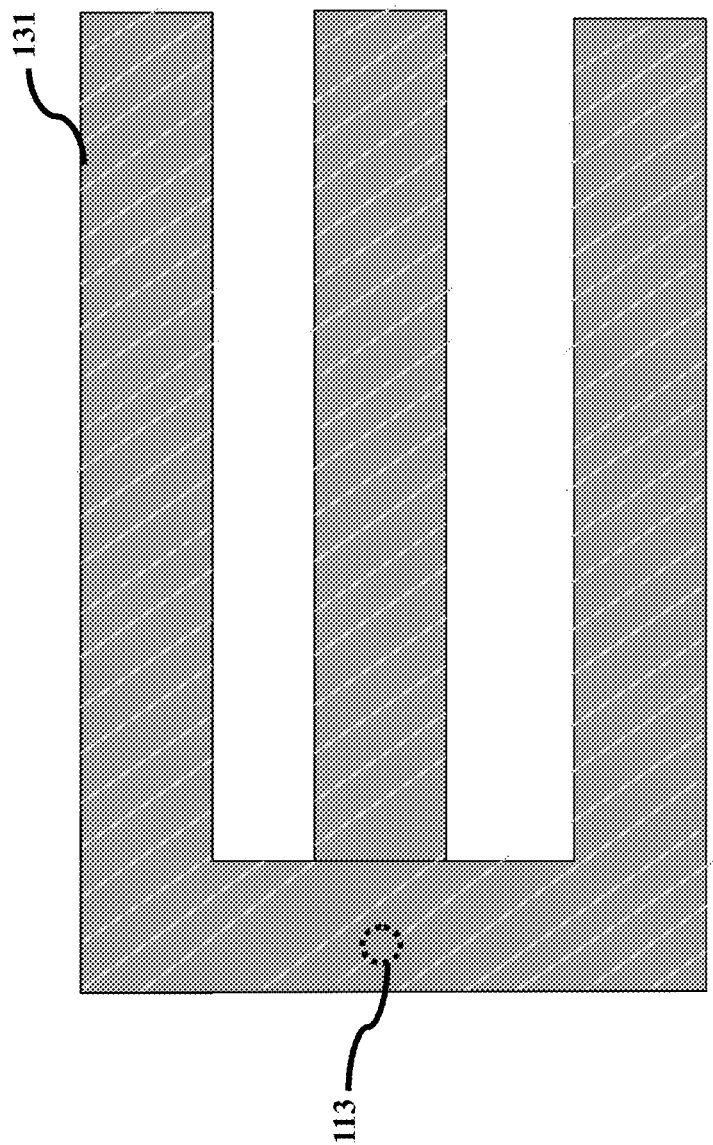
FIG. 1(d) and FIG. 1(e) show the schematics of the feedback waveguide, as embodiments of the present subject matter.
Figure 1:
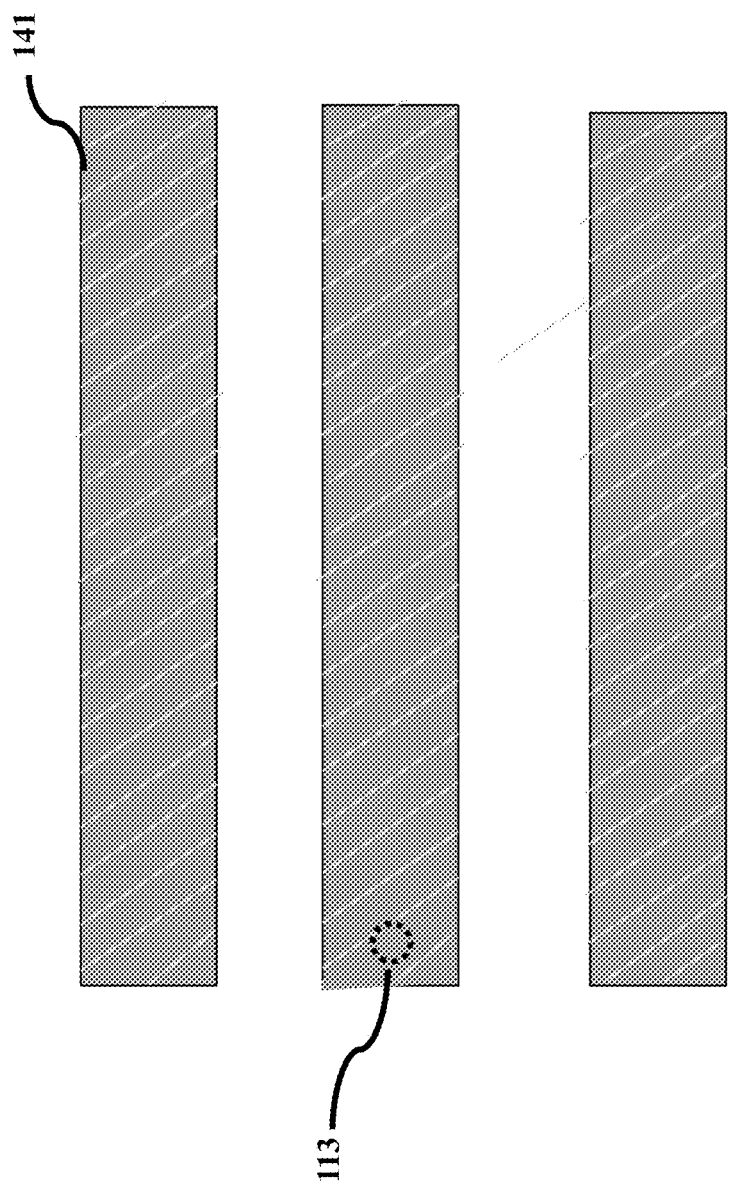
FIG. 1(c) illustrates the schematic of the strip line integrated microwave oscillating element, as one of the embodiments of the present subject matter.

FIG. 1(d) and FIG. 1(e) show the schematics of the feedback waveguide, as embodiments of the present subject matter. However, a person skilled in the art would understand that these are exemplary embodiments of the feedback waveguide configurations or schematics and by no matter limits the scope of the embodiment. The feedback waveguide may be made up of conducting material such as copper, gold, platinum, titanium and the like. Furthermore, it is to mention here that the signal electrode and the ground electrode may also comprise of conducting material such as copper, gold, platinum, titanium and the like.

Figure 2:
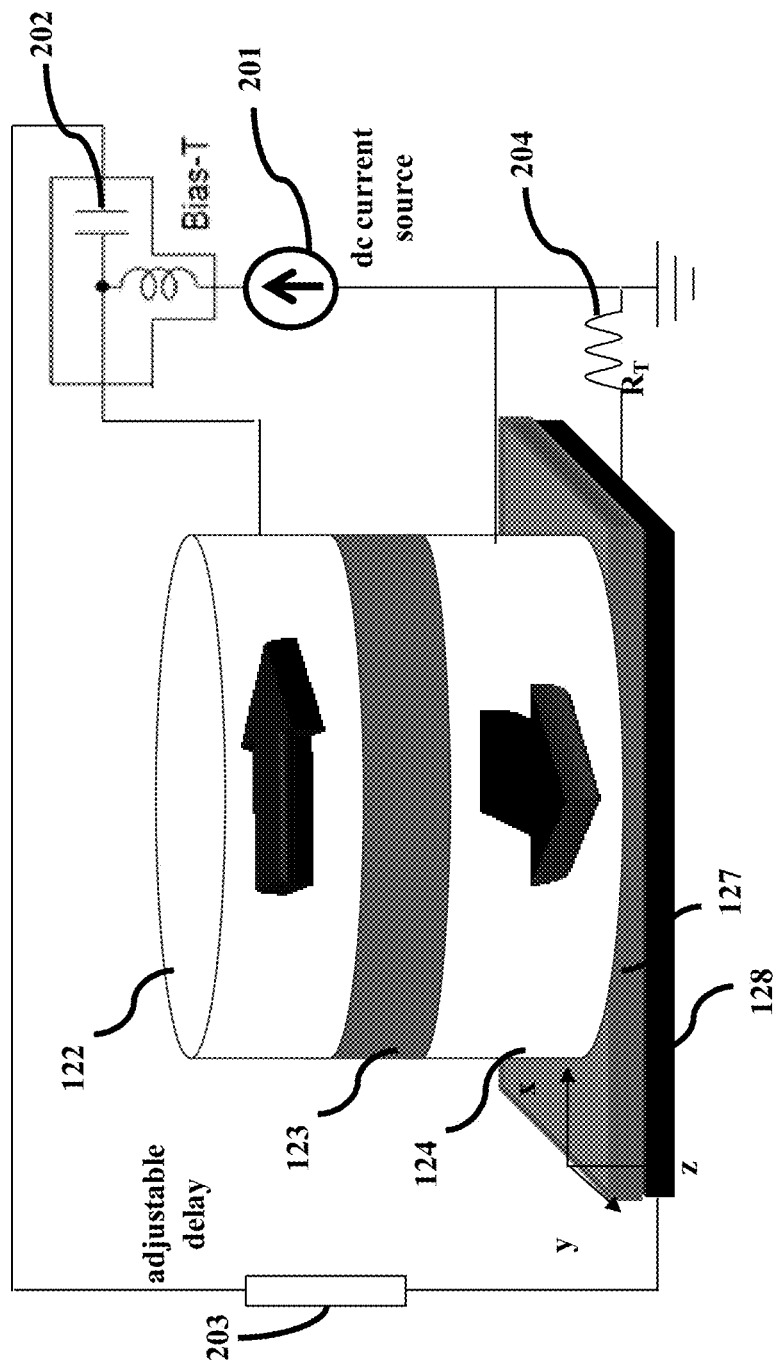
FIG. 2(a) illustrates the schematic diagram of the feedback oscillator circuit as disclosed in the embodiments herein.
FIGS. 2(b) and 2(c) show the schematics of two different circuit connections between the MTJ electrodes and the feedback waveguide as disclosed in the embodiments herein.
Figure 2:
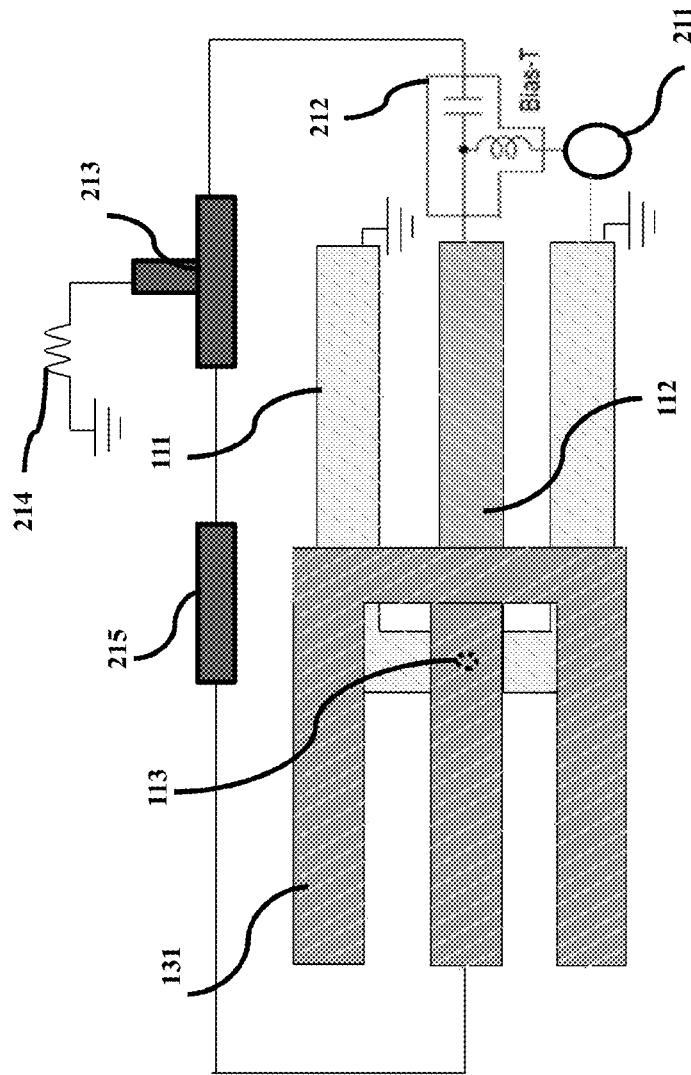
Figure 2:
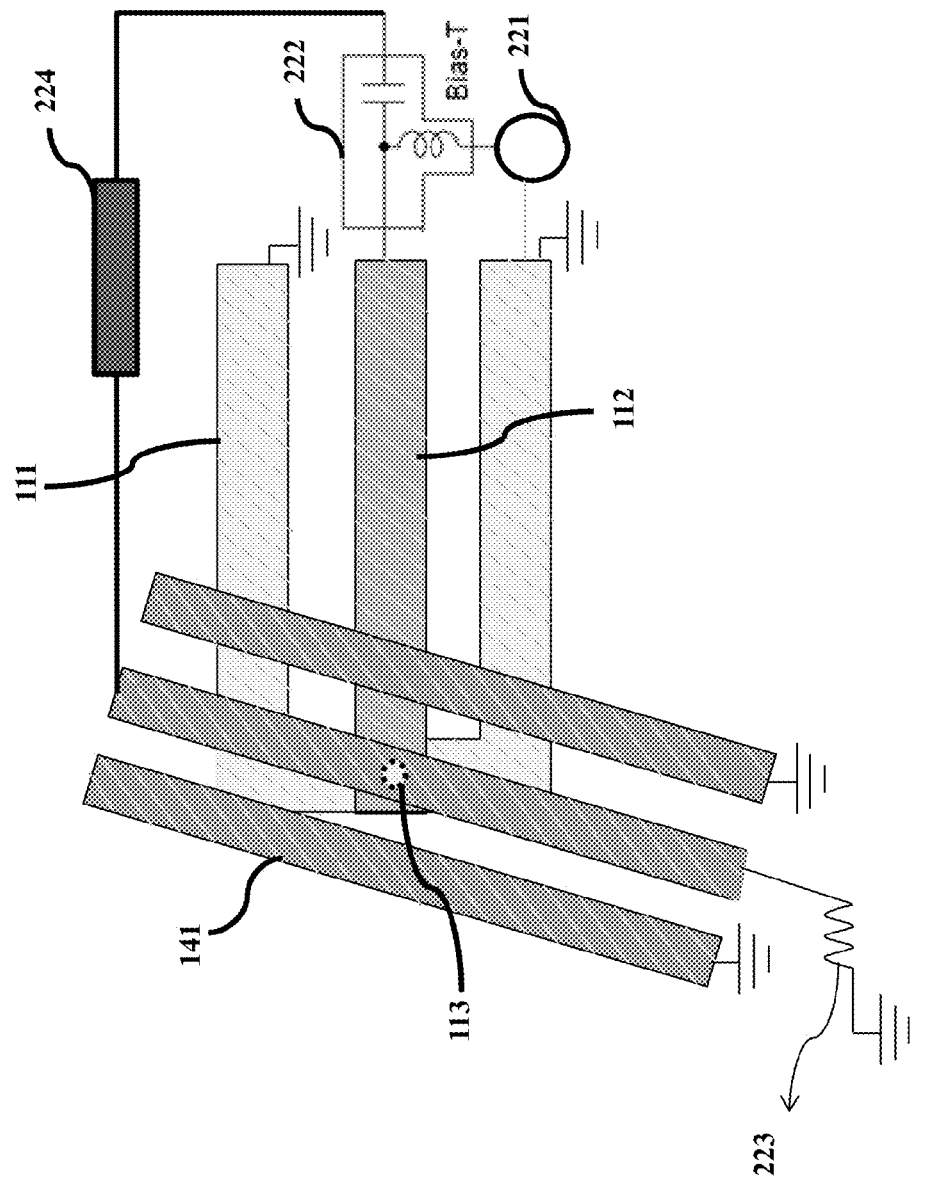

FIG. 2(a) is the schematic diagram of the feedback oscillator circuit as disclosed in the embodiments herein. The top layer of the MTJ pillar (from FIG. 2) represents the free layer, the middle layer represents the tunneling barrier and the bottom layer represents the pinned layer. The MTJ rests on the top of a wave guide which is electrically insulated from the MTJ. The wave guide is terminated into a resistance RT. Further, a fluctuating voltage is produced across the MTJ by the DC current and thermal fluctuations of the free layer. The fluctuating voltage produced drives a fluctuating current through the bottom waveguide and exerts a fluctuating magnetic field on the free layer. The phase of the magnetic field with respect to the free layer oscillation can be adjusted by the adjustable delay and by choosing a suitable value of the phase the free layer oscillations can be amplified.

The easy direction of the free layer is to be taken along the x axis, in-plane hard direction along y axis and the out of plane hard direction along z axis. The pinned layer magnetization is taken to be along the y axis. Further, the top and bottom electrodes of the MTJ are connected to through a bias-T to the wave guide (feedback waveguide). The feedback waveguide is oriented in such a way that a current passing through it creates a magnetic field along y axis. A delay element present in the circuit adjusts the phase of the current flow.

When a DC current is passed through the MTJ, the thermal fluctuations of the free layer produce oscillating voltage across it due to the magneto resistance effect. The oscillating voltage drives an oscillating current through the feedback waveguide, which in turn creates an oscillating magnetic field along y axis. The DC current passing through MTJ is blocked by the bias T from flowing through the feedback waveguide. By choosing a suitable phase of the oscillating current, the magnetization fluctuations of the free layer can be amplified. If the DC current exceeds a critical value, the free layer can undergo spontaneous oscillations.

FIGS. 2(b) and 2(c) show the schematics of two different circuit connections between the MTJ electrodes and the feedback waveguide 141, 131, as two embodiments of the present subject matter. It is however emphasized here that a person skilled in the art would consider these as two exemplary embodiments of the present subject matter and in no matter limits the scope of the embodiment. In FIG. 2(b), a dc current source 221, 211 to generate dc current in the circuit is connected between the two electrodes of the MTJ via a bias-T 222, 212. The Bias-T 222, 212 blocks the dc current from flowing through the feedback waveguide 141 of the strip line integrated microwave oscillating element, while the dc current is being flown through the magnetic tunnel junction structure alone. The bias T 222, 212 further allows an oscillating current to flow through the feedback waveguide 141 of the strip line integrated microwave oscillating element, wherein the oscillating current is being generated by the thermal fluctuations of the elements or materials of the magnetization free layer of the magnetic tunnel junction structure, which in turn generates an oscillating voltage in the magnetization free layer.

The microwave oscillations generated therein are passed to the feedback waveguide 141 through a delay element or phase shifter 224. The load resistance 223 is connected to the other end of feedback waveguide 141.

In the other embodiment as illustrated in FIG. 2(c), a dc current source 211 is connected between the two electrodes of the MTJ via a bias-T 212. Bias-T 212 allows the flow of dc current only through the MTJ, and the microwave voltage is passed to a coupler or circulator 213. From the coupler, the oscillating voltage is passed to the feedback waveguide 131 through a delay element or phase shifter 215. The load resistance 214 is connected to the remaining port of coupler or circulator 213.

The delay element or the phase shifter of the strip line integrated microwave oscillating element may further generate a configurable delay in the phase between the oscillating feedback magnetic field and the oscillating voltage of the free layer magnetization of the magnetic tunnel junction structure, wherein the delay is configured to amplify the microwave oscillation of the strip line integrated microwave oscillating element. Also, the critical value of the dc current required to generate microwave oscillation in the strip line integrated microwave oscillating circuit and the strip line integrated microwave oscillating element may be independent of at least one of the thickness value and the magnetization value of the free magnetization layer of the magnetic tunnel junction structure.

The magnetization dynamics of the free layer is given by Landau-Lifshitz-Gilbert (LLG) equation as:

$$\frac{d\hat{m}}{dt} = -\gamma[\hat{m} \times (\overline{H} + \overline{h}_r)] \pm \alpha\gamma\hat{m} \times [\hat{m} \times (\overline{H} + \overline{h}_r)] \quad (1)$$

Where,
$\hat{m}$ is a unit vector along magnetization,
H is the effective magnetic field (including the anisotropy field and external magnetic field)
$\gamma$ is related to the gyro magnetic factor $\gamma_0$ as $\gamma=\gamma_0/(1+\alpha^2)$
$\alpha$ is the damping factor, the positive sign is to be taken for forward direction of time and negative sign for backward direction of time.
$h_r$ is the random magnetic field due to thermal fluctuations with the statistical properties:

$$\langle h_{r,j}(t)\rangle = 0, \ \langle h_{r,j}(t)h_{r,j}(s)\rangle = 2D\delta_{ij}\delta(t-s), \quad (2)$$

$$D = \frac{\alpha}{1+\alpha^2}\frac{k_B T}{\gamma\mu_0 m}$$

Where < > is the ensemble average
m is the total magnetic moment of the free layer.

The STT term is neglected in equation (2) which is considered reasonable if the free layer magnetic moment is large. In the absence of feedback circuit, the effective field is given as:

$$\overline{H}=(-H_{dx}m_x+H_{ext})\hat{x}-H_{dy}m_y\hat{y}-H_{dz}m_z\hat{z}$$

Where,
$H_{dx}$, $H_{dy}$ and $H_{dz}$ are anisotropy factors along x, y and z directions respectively with $H_{dx}<H_{dy}\leq H_{dz}$. Due to the random magnetic fields appearing in the equation, the direction of magnetization undergoes fluctuations.

The resistance of the MTJ depends on the magnetization direction of the free layer and is given as:

$$R(t)=R_P+(\Delta R/2)(1-m_y(t))$$

Where,
$R_P$ is the resistance in parallel state
$\Delta R$ is the difference between the resistances in anti parallel and parallel states.
Thus, when DC current is passed through MTJ, a fluctuating voltage of $-I_{dc}m_y(t)\Delta R/2$ appears across the MTJ.

Further, the fluctuating ac voltage across the MTJ drives ac current through the feed-back waveguide. It is to be assumed that the feed-back circuit is terminated into a resistance RT which is same as the characteristic impedance of the feed-back circuit. Therefore AC current flowing through the feedback waveguide at the position below the MTJ is given by:

$$I_{ac}(t)=-0.5I_{dc}m_y(t-\Delta t)\Delta R/(R_T+R_{MTJ})$$

Where,
$R_{MTJ}$ is the average resistance of the MTJ.
The resulting AC magnetic field which acts on the free layer is given by:

$$h_{ac}\approx I_{ac}/2w$$

Where,
w is the width of the feedback waveguide.
The magnetic field is written as $h_{ac}(t)=-fI_{dc}m_y(t-\Delta t)\hat{y}$ where the factor f is defined as $$f=\Delta R/[4w(R_T+R_{MTJ})]$$

Thus an additional magnetic field is created with the feedback circuit which should be included in the LLG equation. It is assumed that fluctuations of magnetization are small that is $m_x\sim 1$, $m_y$, $m_z \ll 1$.

The LLG equation is made linear and terms of the form $m_y h_r$ and $m_z h_r$ are neglected. The resulting LLG equation is given as:

$$\dot{m}_y = -\gamma(H_d+H_{ext})m_z \mp \alpha\gamma(H_c+H_{ext})m_y+\gamma h_{r,z} \pm \alpha\gamma h_{r,y} \pm \alpha\gamma fI_{dc}\langle m_y(t-\Delta t)\rangle \quad (3a)$$

$$\dot{m}_z = -\gamma(H_c+H_{ext})m_y \mp \alpha\gamma(H_d+H_{ext})m_z - \gamma h_{r,y} \pm \alpha\gamma h_{r,z} - \alpha\gamma fI_{dc}\langle m_y(t-\Delta t)\rangle \quad (3a)$$

Where,
$H_c=H_{dy}-H_{dx}$ and $H_d=H_{dz}-H_{dx}$.
The ensemble average of the equations is given as:

$$\frac{d}{dt}\langle m_y\rangle = -\gamma(H_d+H_{ext})\langle m_z\rangle \mp \alpha\gamma(H_c+H_{ext})\langle m_y\rangle \pm \alpha\gamma fI_{dc}\langle m_y(t-\Delta t)\rangle \quad (4a)$$

$$\frac{d}{dt}\langle m_z\rangle = \gamma(H_c+H_{ext})\langle m_y\rangle \mp \alpha\gamma(H_d+H_{ext})\langle m_z\rangle \pm \gamma fI_{dc}\langle m_y(t-\Delta t)\rangle \quad (4b)$$

The above equations give the solution for average values of $m_y$ and as $m_z$ for t>0 as $\langle m_y\rangle=\text{Re}[Ae^{-i\omega_0 t}e^{-t/\tau}]$ and $\langle m_z\rangle=\text{Re}[Be^{-i\omega_0 t}e^{-t/\tau}]$ where the precessional frequency and relaxation time are given by:

$$\omega_0=\gamma\sqrt{(H_c+H_{ext})(H_d+H_{ext})}$$

and $$1/\tau=0.5\alpha\gamma(H_d+H_c+2H_{ext})$$

and the constants A and B are determined by the values of $m_y$ and $m_z$ at t=0.

If the average values of $m_y$ and $m_z$ are required, for t<0, the lower sign in the above equation is used which implies that for t<0, the average values are given by $$\langle m_y\rangle=Re[Ae^{-i\omega_0 t}e^{t/\tau}]$$

and $$\langle m_z\rangle=Re[Be^{-i\omega_0 t}e^{t/\tau}]$$

Therefore, if all the trajectories with given values of $m_y$ and $m_z$ at t=0 are considered, the relaxation term is such that the average values of $m_y$ and $m_z$ over these trajectories go to 0 as:

$$t\to\pm\infty$$

To solve the equations including the feedback term, solutions of same form are assumed, but with different precessional frequency (Φ1) and relaxation time (τ1) for average $m_y$ and $m_z$ when feedback term is included. Thus the above equations can be rewritten as:

$$-\left(i\omega_1 + \frac{1}{\tau_1}\right)A = \quad \text{5(a)}$$
$$-\gamma(H_d + H_{ext})B - \alpha\gamma(H_c + H_{ext})A + \alpha\gamma fI_{d\tau}Ae^{i\omega_1\Delta t}e^{-\Delta t/\tau_1} =$$
$$-\gamma(H_d + H_{ext})B - \alpha\gamma(\tilde{H}_c + H_{ext})A$$

$$-\left(i\omega_1 + \frac{1}{\tau_1}\right)B = \quad \text{5(b)}$$
$$\gamma(H_c + H_{ext})A - \alpha\gamma(H_d + H_{ext})B - \gamma fI_{d\tau}Ae^{i\omega_1\Delta t}e^{-\Delta t/\tau_1} =$$
$$\gamma(\tilde{H}_c + H_{ext})A - \alpha\gamma(H_d + H_{ext})B$$

Where,
$\tilde{H}_c = H_c - fI_{dc}e^{i\omega_1\Delta t}e^{-\Delta t/\tau_1}$ is the effective coercive field.

In general, the effective Hc is complex and it changes the precessional frequency as well as the relaxation time. Further, it is assumed that $\Delta t/\tau_1 \ll 1$. Thus, the effective coercive field is given by $\tilde{H}_c = H_c - ifI_{dc}$ Solving equation (5) for this case, $\omega_1 \approx \omega_0$ is the result and the relaxation time is modified as:

$$\frac{1}{\tau_1} \approx \frac{1}{\tau} + 0.5 f \, I_{dc}\gamma\sqrt{\frac{(H_d + H_{ext})}{(H_c + H_{ext})}} \quad (6)$$

It can be seen that the positive value of the DC current increases the damping while negative value decreases the damping. If Δt is chosen such that $\omega_0\Delta t = 3\pi/2$, the effective coercive field is real, and for small DC current, the dominant effect is change in the precessional frequency. For a general value of Δt, there are changes in the real and imaginary part of the coercive field. However, to obtain optimum change in damping Δt should be chosen such that change in coercive field is purely imaginary. Choose $\omega_0 \Delta t = (2n+1)\pi/2$, where n is non negative integer. Further large values of n imply large values of Δt, and the factor of exp $(-\Delta t/\tau_1)$ in the effective coercive field should not be neglected which indicates that larger values of DC current would be necessary to get the same change in damping. Thus $\omega_0 \Delta t = \pi/2$ is the best choice for changing damping.

Figure 3A:
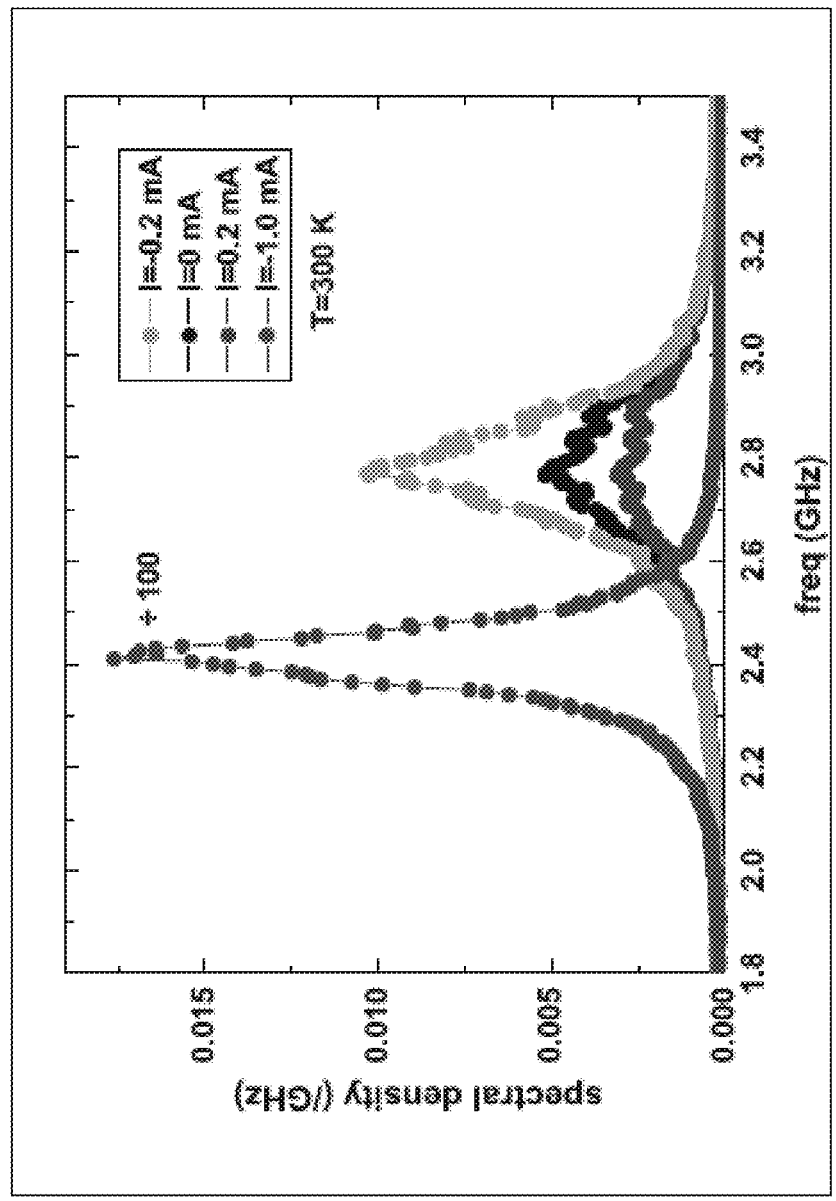
FIG. 3(a) demonstrates the graphical demonstration/representation of the spectral density of $m_y$ as a function of frequency at room temperature as disclosed in the embodiments herein.

FIG. 3(a) depicts the spectral density of $m_y$ (defined as Fourier transform of the correlation function) as a function of frequency of the free magnetization layer at room temperature, as one of the exemplary elucidation of the present embodiment. The green, black and red curves show the spectral density obtained for −0.2 mA, 0 mA and 0.2 mA dc current respectively. The value of Δt was chosen such that $\omega\Delta t = \pi/2$. The figure illustrates that for positive current, the spectral density may be reduced, while for negative current it may be enhanced. Thus the damping may be enhanced for positive current, and may be reduced for negative current. The blue curve shows the large spectral density obtained for −1 mA, which is more than the critical current (for $\omega\Delta t = 0.6\pi$). The precession frequency obtained is different from the low current case.

Figure 3B:
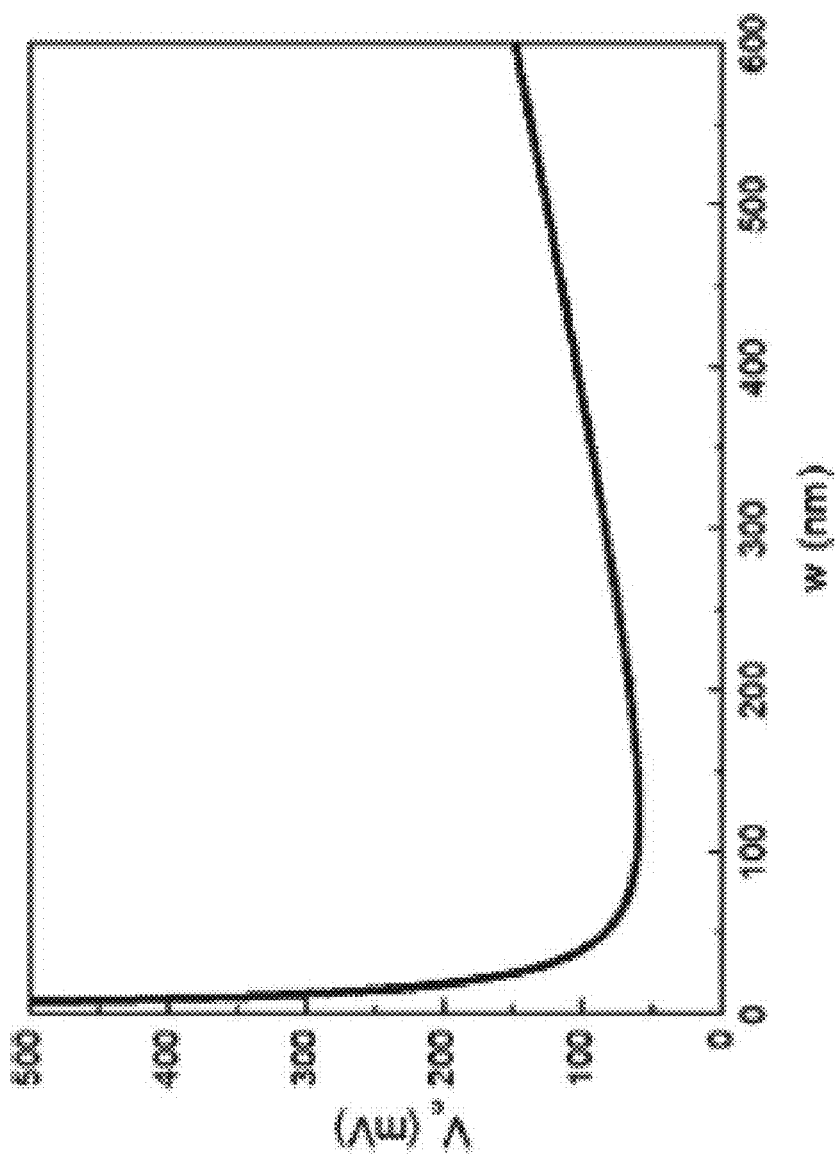
FIG. 3(b) depicts graphical demonstration/representation of the variation of the voltage to angular frequency as disclosed in the embodiments herein.

FIG. 3(b) is a graph of variation of voltage to resonance frequency as disclosed in the embodiments herein. The critical voltage required for spontaneous oscillations is as a function of the width of the free layer. The width of the feedback waveguide is assumed to be equal to the width of the free layer and the length of the free layer is taken to be 4 times the width. From equation 6, it can be implied that for certain large negative DC current, the damping becomes zero, implying the onset of oscillations. However, if the damping becomes small, it implies that thermal functions increase which indicates that the assumption of small fluctuations required to obtain linearized LLG would not hold for large negative currents. Further, the fluctuations for a given value of DC current depend on the temperature. Lower the temperature, smaller are the fluctuations which signifies that the assumption of small fluctuations is valid till the critical current in the limit of zero temperature. Thus, the critical current required for instability at zero temperature can be found from equation (6) by setting $1/\tau_1$ to 0. For the case where, the out of plane demagnetization field is very large, that is Hd≫Hc, Hext, the expression for the critical current comes out to be:

$$I_c \approx -\alpha\sqrt{H_\perp(H_{//} + H_{ext})}/f \approx -\alpha\omega_0/f \quad (7)$$

Further, from the above analysis, it can be shown that the equilibrium position $m_x = 1$ is unstable for DC current more than critical current. From another analysis, it can be shown that $m_x = -1$ state is unstable if the external magnetic field is zero. Thus, the free layer magnetization is driven into spontaneous oscillations if the DC current exceeds the critical value. Further, consider where external magnetic field is applied along the easy axis such that $H_{ext} < H_c$. The resonant frequency of oscillation is different for $m_x = 1$ and $m_x = -1$ states. Since the critical current depends on the oscillation frequency as well as on the factor $\omega\Delta t$, it may result in one state being stable and the other unstable.

Consider a MgO based MTJ with $R_P = 100\Omega$, $\Delta R = 100\Omega$, $R_T = 50\ \Omega$, $\alpha = 10^{-2}$, $H_d = 10^4$ Oe, $H_c = 100$ Oe, $\gamma = 2.21 \times 10^5$ SI units and free layer dimensions of 200 nm×100 nm×2 nm. Consider the width of the feedback waveguide as the width of the free layer that is ω=100 nm. The resonant frequency and critical current then comes out to be $f_0 = 3$ GHz and $I_c = 0.62$ mA respectively. Further, the value of the critical current is independent of the length and thickness of the free layer as long as the resonant frequency is the same. The dependence of critical voltage on the width of the free layer is as shown in FIG. 3. From the graph, it is assumed that the length of the free layer is 4 times the width and the resonance frequency is held constant as and when the width is changed. The graph is obtained by assuming a MTJ with resistance area product=3 $\Omega(mm)^2$, $\alpha = 10^{-2}$, $\gamma = 2.21 \times 10^5$ SI units, 100% magneto-resistance, $R_T = 50$) and resonance frequency of 3 GHz.

Further from FIG. 3 (b), the optimum value of the width is about 100 nm. It is understood from the aspect of a feedback oscillator that the critical current is independent of the thickness and magnetization of the free layer. For spintronic feedback oscillators, a free layer should be chosen with large magnetization and thickness which would increase the total magnetic moment of the free layer and decrease the strength of the thermal fluctuations D. As a result, the line width of the oscillation would be smaller. The spin transfer torque (STT) effect and feedback circuit thus may be combined in the same device.

Figure 4:
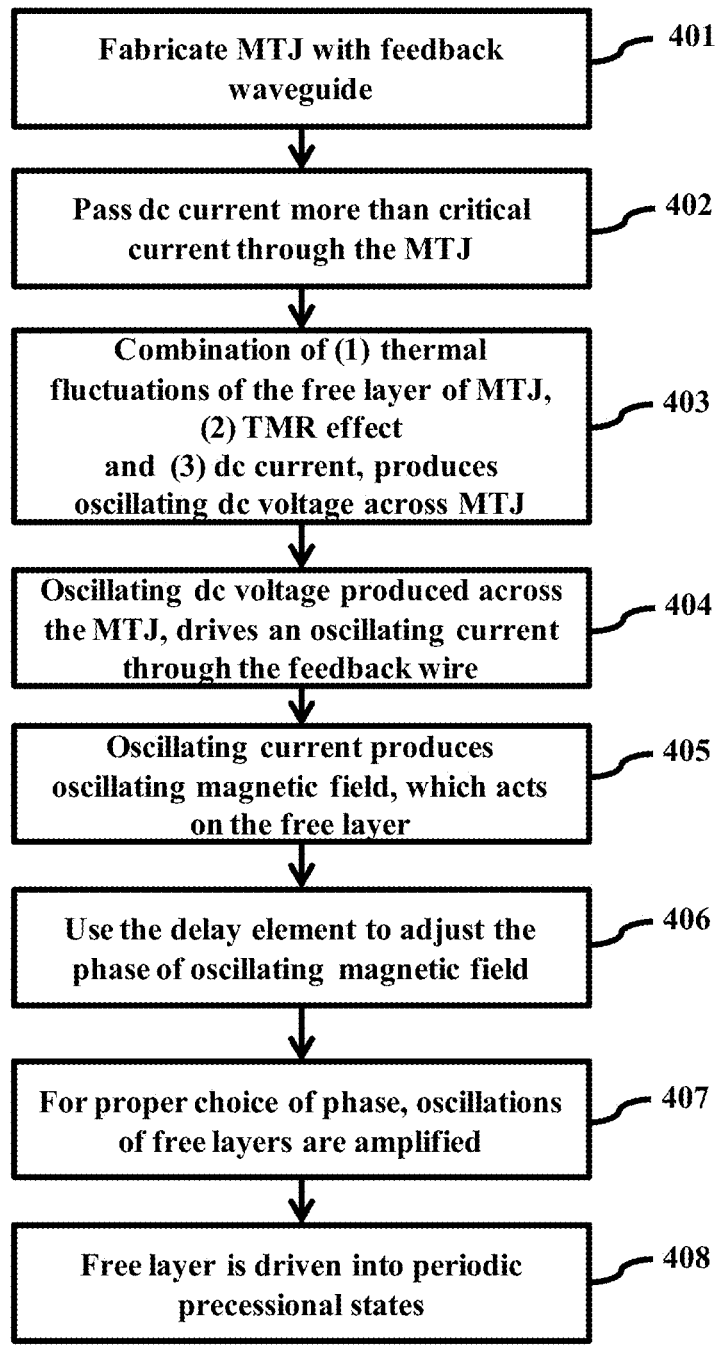
FIG. 4 depicts a flow diagram of the process, according to embodiments as disclosed herein.

FIG. 4 depicts a flow diagram of the method, according to embodiments as disclosed herein.

The method comprises passing a dc current from a dc current source through a magnetic tunnel junction structure, wherein the dc current is above the critical value of the dc current.

This in turn many generate an oscillating voltage across the magnetization free layer of the magnetic tunnel junction structure by at least from the thermal fluctuations of the elements or materials of the magnetization free layer. Such an oscillating voltage may produce an oscillating current through a feedback waveguide being connected and insulated from the magnetic tunnel junction structure by the generation of the oscillating voltage across the magnetization free layer and thereby may create microwave oscillation in the magnetization free layer of the magnetic tunnel junction structure by exerting an oscillating feedback magnetic field by the feedback waveguide on the magnetization free layer.

The method of generating microwave oscillation in a strip line integrated microwave oscillating circuit as an embodiment of the present subject matter may comprise the damping of the microwave oscillation in the free magnetization layer of the magnetic tunnel junction structure to be controlled by the dc current and at least one of a configurable delay element and a phase shifter connected to the signal electrode and the feedback waveguide of the strip line integrated microwave oscillating element.

Furthermore, by the method of generating microwave oscillation in a strip line integrated microwave oscillating circuit as an embodiment of the present embodiment, at least one of the quality factor and the power output of the microwave oscillation in the free magnetization layer of the magnetic tunnel junction structure may increase over the microwave oscillation being generated by the spin transfer torque effect alone, wherein the quality factor is determined by the value of the width of the frequency spectrum divided by the peak frequency. Moreover, the generation of the microwave oscillation can be used in combination with the microwave oscillation generated by the spin transfer torque effect.

The embodiments herein disclose a spintronic oscillator by magnetic feedback. Referring now to the drawings, and more particularly to FIGS. 1 through 4, where similar reference characters denote corresponding features consistently throughout the figures, there are shown embodiments.

The embodiments disclosed herein can be implemented through at least one software program running on at least one hardware device and performing network management functions to control the network elements. The network elements shown in FIG. 2 include blocks which can be at least one of a hardware device, or a combination of hardware device and software module.

The embodiment disclosed herein specifies a system for magnetic field feedback based spintronic oscillator. The mechanism allows magnetization of precession states providing a system thereof. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device can be any kind of device which can be programmed including e.g. any kind of computer like a server or a personal computer, or the like, or any combination thereof, e.g. one processor and two FPGAs. The device may also include means which could be e.g. hardware means like e.g. an ASIC, or a combination of hardware and software means, e.g. an ASIC and an FPGA, or at least one microprocessor and at least one memory with software modules located therein. Thus, the means are at least one hardware means and/or at least one software means. The method embodiments described herein could be implemented in pure hardware or partly in hardware and partly in software. The device may also include only software means. Alternatively, the embodiment may be implemented on different hardware devices, e.g. using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims as described herein.

What is claimed is:

1. A strip line integrated microwave oscillating element comprising:
  a strip line having a signal electrode and a ground electrode;
  a Magnetic Tunnel Junction (MTJ) structure residing within the signal electrode and the ground electrode, wherein the MTJ structure further comprises
    a magnetization fixed layer formed of a ferromagnetic material and being in contact with at least one of the signal electrode and the ground electrode;
    a tunnel barrier layer; and
    a magnetization free layer in contact with at least one of the signal electrode and the ground electrode, wherein a magnetization vector of the magnetization free layer has a component perpendicular to the magnetization vector of the magnetization fixed layer; and
  a feedback waveguide insulated electrically from the MTJ structure by an electrically insulating layer; wherein an oscillating feedback magnetic field created by the feedback waveguide has a component perpendicular to the magnetization vector of the magnetization free layer of the MTJ structure.

2. The strip line integrated microwave oscillating element, as claimed in claim 1, wherein the signal electrode, the ground electrode and the feedback waveguide comprise of a conducting metal.

3. A strip line integrated microwave oscillating circuit comprising:
  a dc current source connected between a signal electrode and the ground electrode of a strip line integrated microwave oscillating element;
  a bias T and at least one of a configurable delay element and a phase shifter connected between the signal electrode and a feedback waveguide of the strip line integrated microwave oscillating element; and
  a load resistance connected between the feedback waveguide and the ground electrode of the strip line integrated microwave oscillating element.

4. The strip line integrated microwave oscillating circuit, as claimed in claim 3, wherein the bias T blocks the dc current from flowing through the feedback waveguide of the strip line integrated microwave oscillating element, while the dc current is being flown through a Magnetic Tunnel Junction (MTJ) structure present in the strip line integrated microwave oscillating element.

5. The strip line integrated microwave oscillating circuit, as claimed in claim 3, wherein the bias T allows an oscillating current to flow through the feedback waveguide of the strip line integrated microwave oscillating element, wherein the oscillating current is being generated by the thermal fluctuations of the elements/materials of the magnetization free layer of the MTJ structure, which in turn generates an oscillating voltage in a magnetization free layer in the MTJ structure.

6. The strip line integrated microwave oscillating circuit, as claimed in claim 3, wherein at least one of the delay element and the phase shifter of the strip line integrated microwave oscillating element generates a configurable delay in the phase between an oscillating feedback magnetic field and the oscillating voltage of the magnetization free layer magnetization of the MTJ structure, wherein the configurable delay amplifies the microwave oscillation of the strip line integrated microwave oscillating element.

7. The strip line integrated microwave oscillating circuit, as claimed in claim 3, wherein the critical value of the dc current required to generate microwave oscillation in the strip line integrated microwave oscillating circuit and the strip line integrated microwave oscillating element is independent of at least one of the thickness value and the magnetization value of the free magnetization layer of the magnetic tunnel junction structure.

8. The strip line integrated microwave oscillating circuit, as claimed in claim 3, wherein the strip line integrated microwave oscillating circuit and the strip line integrated microwave oscillating element are configured for generating microwave oscillation by:
    passing a dc current from the dc current source through the MTJ structure, wherein the dc current is above a critical value of the dc current;
    generating an oscillating voltage across the magnetization free layer of the MTJ structure using at least one of thermal fluctuations of the magnetization free layer;
    producing an oscillating current through the feedback waveguide being connected and insulated from the MTJ structure by the generation of the oscillating voltage across the magnetization free layer; and
    creating microwave oscillation in the magnetization free layer of the MTJ structure by exerting an oscillating feedback magnetic field by the feedback waveguide on the magnetization free layer.

9. The strip line integrated microwave oscillating circuit, as claimed in claim 8, wherein the microwave oscillation is used in combination with the microwave oscillation generated by the spin transfer torque effect.

10. The strip line integrated microwave oscillating circuit, as claimed in claim 8, wherein the frequency of the generated microwave oscillation can be controlled by an external magnetic field applied on the free magnetization layer of the MTJ structure.

11. The strip line integrated microwave oscillating circuit, as claimed in claim 8, wherein the frequency of the generated microwave oscillation can be controlled by at least one of the delay element and the phase shifter.

12. A strip line integrated microwave oscillating circuit comprising:
    a dc current source connected between a signal electrode and the ground electrode of a strip line integrated microwave oscillating element;
    a bias T, at least one of a coupler and a circulator and at least one of a configurable delay element and a phase shifter connected between the signal electrode and a feedback waveguide of the strip line integrated microwave oscillating element; and
    a load resistance connected between at least one of the coupler; and circulator and the ground.

13. The strip line integrated microwave oscillating circuit, as claimed in claim 12, wherein the bias T blocks the dc current from flowing through the feedback waveguide of the strip line integrated microwave oscillating element, while the dc current is being flown through a Magnetic Tunnel Junction (MTJ) structure present in the strip line integrated microwave oscillating element.

14. The strip line integrated microwave oscillating circuit, as claimed in claim 12, wherein the bias T allows an oscillating current to flow through the feedback waveguide of the strip line integrated microwave oscillating element, wherein the oscillating current is being generated by the thermal fluctuations of the elements/materials of the magnetization free layer of the MTJ structure, which in turn generates an oscillating voltage in a magnetization free layer in the MTJ structure.

15. The strip line integrated microwave oscillating circuit, as claimed in claim 12, wherein at least one of the delay element and the phase shifter of the strip line integrated microwave oscillating element generates a configurable delay in the phase between an oscillating feedback magnetic field and the oscillating voltage of the magnetization free layer magnetization of the MTJ structure, wherein the configurable delay amplifies the microwave oscillation of the strip line integrated microwave oscillating element.

16. The strip line integrated microwave oscillating circuit, as claimed in claim 12, wherein the critical value of the dc current required to generate microwave oscillation in the strip line integrated microwave oscillating circuit and the strip line integrated microwave oscillating element is independent of at least one of the thickness value and the magnetization value of the free magnetization layer of the magnetic tunnel junction structure.

17. The strip line integrated microwave oscillating circuit, as claimed in claim 12, wherein a strip line integrated microwave oscillating circuit and a strip line integrated microwave oscillating element is configured for generating microwave oscillation by:
    passing a dc current from the dc current source through the MTJ structure, wherein the dc current is above a critical value of the dc current;
    generating an oscillating voltage across the magnetization free layer of the MTJ structure using at least one of thermal fluctuations of the magnetization free layer;
    producing an oscillating current through the feedback waveguide being connected and insulated from the MTJ structure by the generation of the oscillating voltage across the magnetization free layer; and
    creating microwave oscillation in the magnetization free layer of the MTJ structure by exerting an oscillating feedback magnetic field by the feedback waveguide on the magnetization free layer.

18. The strip line integrated microwave oscillating circuit, as claimed in claim 12, wherein the microwave oscillation is used in combination with the microwave oscillation generated by the spin transfer torque effect.

19. The strip line integrated microwave oscillating circuit, as claimed in claim 12, wherein the frequency of the generated microwave oscillation can be controlled by an external magnetic field applied on the free magnetization layer of the MTJ structure.

20. The strip line integrated microwave oscillating circuit, as claimed in claim 12, wherein the frequency of the generated microwave oscillation can be controlled by at least one of the delay element and the phase shifter.

21. A method for generating microwave oscillation in a strip line integrated microwave oscillating circuit and a strip line integrated microwave oscillating element comprising:
    passing a dc current from a dc current source through a Magnetic Tunnel Junction (MTJ) structure, wherein the dc current is above a critical value of the dc current;
    generating an oscillating voltage across a magnetization free layer of the MTJ structure using at least one of thermal fluctuations of the magnetization free layer;
    producing an oscillating current through a feedback waveguide being connected and insulated from the MTJ structure by the generation of the oscillating voltage across the magnetization free layer; and
    creating microwave oscillation in the magnetization free layer of the MTJ structure by exerting an oscillating feedback magnetic field by the feedback waveguide on the magnetization free layer.

22. The method of generating microwave oscillation in a strip line integrated microwave oscillating circuit and a strip line integrated microwave oscillating element as claimed in claim 21, wherein the critical value of the dc current exceeds negative of 0.6 mA for a resonant frequency in the range of 2.8 GHz and for a width of the free layer to be of the order of 100 nm.

23. The method of generating microwave oscillation in a strip line integrated microwave oscillating circuit as claimed in claim 21, wherein damping of the microwave oscillation in the free magnetization layer of the magnetic tunnel junction structure can be controlled by the dc current and at least one of a configurable delay element and a phase shifter connected to the signal electrode and the feedback waveguide of the strip line integrated microwave oscillating element.

24. The method of generating microwave oscillation in a strip line integrated microwave oscillating circuit as claimed in claim 21, wherein at least one of quality factor and power output of the microwave oscillation in the free magnetization layer of the magnetic tunnel junction structure increases over the microwave oscillation being generated by the spin transfer torque effect alone; wherein the quality factor is determined by the value of the width of the frequency spectrum divided by the peak frequency.

* * * * *